United States Patent [19]

McAdams

[11] Patent Number: 5,347,173
[45] Date of Patent: Sep. 13, 1994

[54] DYNAMIC MEMORY, A POWER UP DETECTION CIRCUIT, AND A LEVEL DETECTION CIRCUIT

[75] Inventor: Hugh P. McAdams, Houston, Tex.

[73] Assignee: Texas Instruments Incorporated, Dallas, Tex.

[21] Appl. No.: 908,633

[22] Filed: Jul. 2, 1992

Related U.S. Application Data

[63] Continuation of Ser. No. 560,542, Jul. 31, 1990, abandoned.

[51] Int. Cl.$^5$ .......................... H03K 3/01; H03K 3/26
[52] U.S. Cl. ................... 307/296.4; 307/272.3; 307/279; 307/592; 307/594
[58] Field of Search ............... 307/296.4, 222.3, 279, 307/592, 594

[56] References Cited

U.S. PATENT DOCUMENTS 4,692,904  8/1987  Sato et al. ..................... 365/226
4,886,983  12/1989  Taka ............................ 307/272.3

FOREIGN PATENT DOCUMENTS 0032716  2/1989  Japan ........................... 307/272.3

*Primary Examiner*—Margaret Rose Wambach
*Attorney, Agent, or Firm*—Lawrence J. Bassuk; Robby T. Holland; Richard L. Donaldson

[57] ABSTRACT

A voltage level detection circuit is disclosed. The circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltge is above the reference potential. The voltage level detection circuitry is controlled by the oscillator signal, for controlling a voltage obtained from the external voltage, to the reading and writing circuitry and to the array to prevent the voltage from being applied unless the voltage at least of a predetermined minimum value. It may contain a circuit for sampling the obtained voltage during selected oscillator cycles to determine whether the obtained voltage is above the predetermined value. Other elements may be added to further enhance performance of the circuit.

5 Claims, 2 Drawing Sheets

DYNAMIC MEMORY, A POWER UP DETECTION CIRCUIT, AND A LEVEL DETECTION CIRCUIT

This application is a continuation of application Ser. No. 07/560,542 filed Jul. 31, 1990, now abandoned.

CROSS-REFERENCE TO RELATED APPLICATIONS

This application cross references and incorporates by reference, the following simultaneously filed, co-pending and co-assigned applications of Texas Instruments Incorporated:

| Ser. No. | TI-Docket | Title |
| --- | --- | --- |
| 07/560,983 | TI-15378 | A Counter Circuit |
| 07/560,961 | TI-15379 | A Configuration Selection Circuit for a Semi-conductor Device |
| 07/560,962 | TI-15380 | A Pulse Generation Circuit |
| 07/560,541 | TI-15381 | A CMOS Single Input Buffer for Multiplexed Inputs |
| 07/560,982 | TI-15382 | A Test Validation Method for a Semi-Conductor Memory Device |
| 07/560,523 | TI-15383 | A Voltage Reference Initialization Circuit |
| 07/560,934 | TI-15384 | A Power up Detection Circuit |
| 07/561536 | TI-15012 | A Power Up Reset Circuit |
| 07/560,662 | TI-15385 | A Substrate Bias Generator System |
| 07/560,720 | TI-14642 | A Circuit and Method for Two Stage Redundancy Decoding |
| 07/560,935 | TI-15389 | A Method for Initializing Redundant Circuitry |
| 07/560,646 | TI-14756 | A Voltage Driver Circuit |

FIELD OF THE INVENTION

This invention is in the field of integrated circuits, and is more specifically related to memory devices.

BACKGROUND OF THE INVENTION

The development of VLSI semi-conductor devices of the Dynamic Random Access Memory (DRAM) type is well known. Over the years, the industry has steadily progressed from DRAMS of the 16K type (as shown in the U.S. Pat. No. 4,081,701 issued to White, McAdams and Rewline), to DRAMS of the 64K type (as shown in U.S. Pat. No. 4,055,444 issued to Rao) to DRAMS of the 1MB type (as shown in U.S. Pat. No. 4,658,377 issued McElroy), and progressed to DRAMS of the 4MB type. The 16MB DRAM, wherein more than 16 million memory cells are contained on a single semiconductor chip is the next generation of DRAMs scheduled for production.

In designing VLSI semiconductor memory devices of the 16MB DRAM type, designers are faced with numerous challenges. One area of concern is power consumption. The device must be able to power the increased memory cells and the supporting circuits, However, for commercial viability, the device must not use excessive power. The power supplies used and the burn in voltage for the part must also be compatible with the thin gate oxides in the device.

Another area of concern is the elimination of defects. The development of larger DRAMS has been fostered by the reduction in memory cell geometries, as illustrated in U.S. Pat. No. 4,240,092 to KUO (a planar capacitor cell) and as illustrated in U.S. Pat. No. 4,721,987 to Baglee et. al. (a trench capacitor cell). The extremely small geometries of the 16MB DRAM will be manufactured using sub-micron technology. The reduction in feature size has meant that particles that previously did not cause problems in the fabrication process, now can cause circuit defects and device failures.

In order to ameliorate defects, redundancy schemes have been introduced. The redundancy schemes normally consisted of a few extra rows and columns of memory cells that are placed within the memory array to replace defective rows and columns of memory cells. Designers need new and improved redundancy schemes in order to effectively and efficiently repair defects and thereby increase yields of 16MB DRAM chips.

Another area of concern is testing. The device must have circuits to allow for the industry standards $16 \times$ parallel tests. In addition, other circuits and test schemes are needed for internal production use to verify operability and reliability.

The options that the device should have is another cause for concern. For instance, some customers require a X1 device, while others require a X4 device. Some require an enhanced page mode of operation. Additionally, it is yet undecided whether the DRAM industry will maintain 4096-cycle refresh, or move towards a lower number of refresh cycles.

Another cause for concern is the physical layout of the chip. The memory cells and supporting circuits must fit on a semiconductor chip of reasonable size. The size of the packaged device must be acceptable to buyers.

New design strategies and circuits are required to meet the above concerns, and other concerns, relating to the development of the next generation, and to future generations, of Dynamic Random Access Memory devices.

It is an object of this invention to provide a voltage level detection circuit. The circuit may be used to prevent voltage from being applied to a semiconductor device unless the voltage is at least of a predetermined value.

Other objects and advantages of this invention become apparent to those of ordinary skill in the art, having reference to the following specification, together with the drawings.

SUMMARY OF THE INVENTION

A voltage level detection circuit is disclosed. The circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltge is above the reference potential. The voltage level detection circuitry is controlled by the oscillator signal, for controlling a voltage obtained from the external voltage, to the reading and writing circuitry and to the array to prevent the voltage from being applied unless the voltage at least of a predetermined minimum value. It may contain a circuit for sampling the obtained voltage during selected oscillator cycles to determine whether the obtained voltage is above the predetermined value. Other elements may be added to further enhance performance of the circuit.

BRIEF DESCRIPTION OF THE DRAWINGS

FIG. 1 illustrates the level detection circuit LVLDET. Signal PBOSC is connected to inverter 119:IV1. The output of inverter 119:IV1 is connected to the input of delay stage 119:XD4. The output of delay stage 119:XD4 is connected to the input of divide by two device 119:XDB2. The output of divide by two device 119:XDB2 is connected to the input of inverter 119:IV2 at node 119:B. The output of inverter 119:IV2 is connected to NODE 119:B_.

In FIG. 1, P channel transistor 119:MP1 is connected between VPERI and NODE 119:N1. Its gate is connected to NODE 119:B. The gate of N channel transistor 119:C1 is connected to NODE 119:N1. Its source and drain are connected together and connected to VSS. N channel transistor 119:MN1 is connected between NODE 119:N1 and NODE 119:N2. Its gate is connected to NODE 119:B. N channel transistor 119:MN2 is connected between NODE 119:N2 and VSS. Its gate is connected to NODE 119:B_. The gate of N channel transistor 119:C2 is connected to NODE 119:N2. Its source and drain are connected together and connected to VSS.

Figure 1:
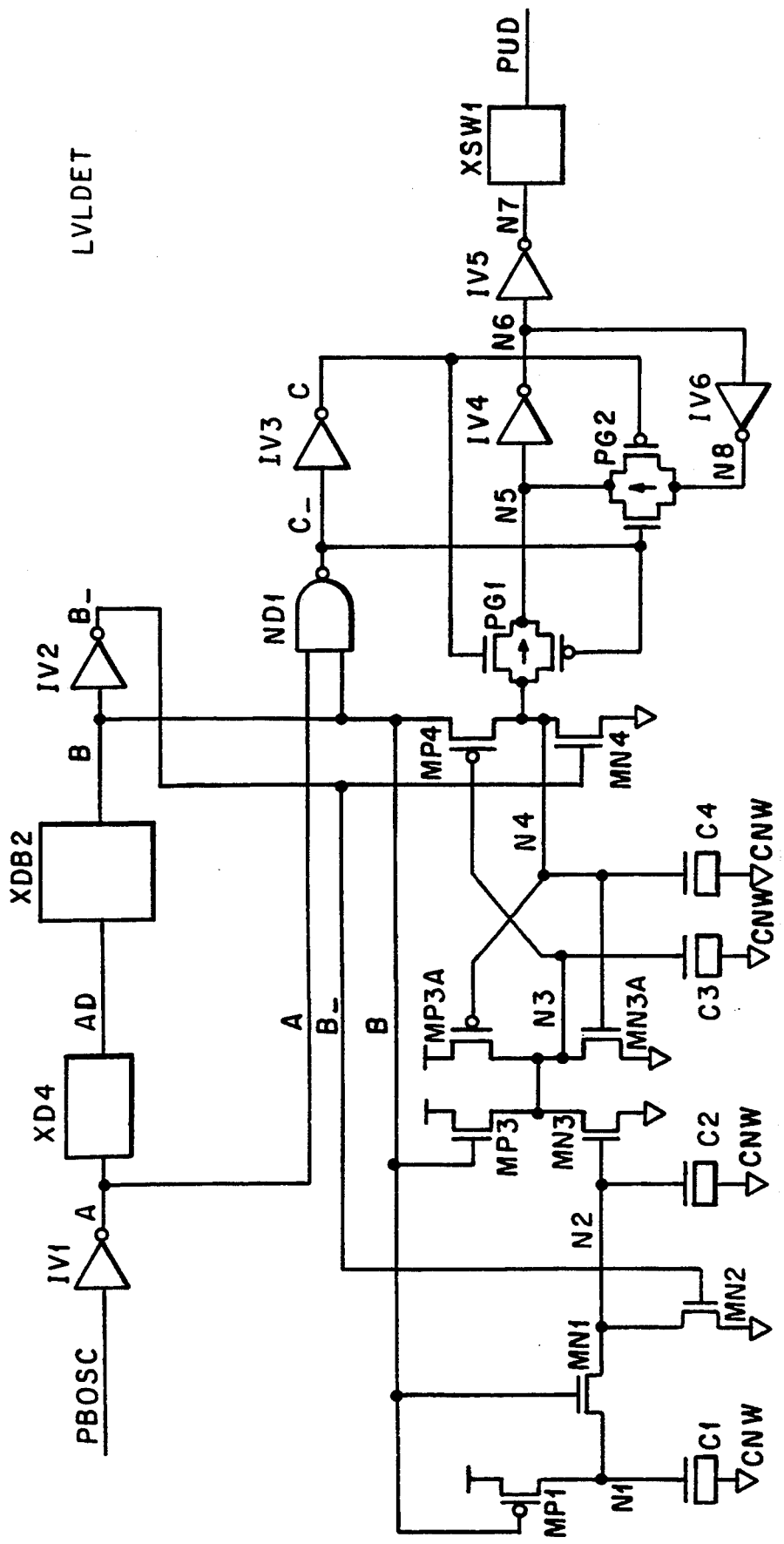
FIG. 1 illustrates the Level Detector Circuit, LVLDET.

In the level detection circuit of FIG. 1, the gate of N channel transistor MN3 is connected to NODE 119:N2. The transistor 119:MN3 is connected between NODE 119:N3 and VSS. Transistor 119:MN3A is also connected between NODE 119:N3 and VSS. Its gate is connected to NODE 119:N4. P channel transistor 119:MP3 is connected between VPERI and NODE 119:N3. Its gate is connected to NODE 119:B. P channel transistor 119:MP3A is also connected between VPERI and NODE 119:N3. Its gate is connected to NODE 119:N4. The gate of N channel transistor 119:C3 is connected to NODE 119:N3. Its source and substrate are connected together and connected to VSS. The gate of N channel transistors 119:MN3A and 119:C4 are connected together and connected to NODE 119:N4. The source and substrate of transistor 119:C4 are connected together and connected to VSS.

In FIG. 1, the output of inverter 119:IV1 is connected to the input of NAND gate 119:ND1. The other input to NAND gate 119:ND1 is NODE 119:B. The output of NAND gate 119:ND1 is connected to NODE 119:C_. NODE 119:C_is connected to the input of inverter 119:IV3. The output of inverter 119:IV3 is connected to NODE 119:C. P channel transistor 119:MP4 is connected between NODE 119:B and NODE 119:N4. Its gate is connected to NODE 119:N3. N channel transistor 119:MN4 is connected between NODE 119:N4 and VSS. Its gate is connected to NODE 119:B_. NODE 119:N4 is connected to the input of pass gate device 119:PG1. The N channel gate of pass gate device 119:PG1 is connected to NODE 119:C. The P channel gate of device 119:PG1 is connected to NODE 119:C_. The output of pass gate device 119:PG1 is connected to NODE 119:N5.

In the level detection circuit of FIG. 1, NODE 119:N5 is coupled through inverter 119:IV4 to NODE 119:N6. NODE 119:N6 is coupled through inverter 119:IV6 to the input of pass gate device 119:PG2. The output of pass gate device 119:PG2 is connected to NODE 119:N5. The N channel gate of the pass gate device 119:PG2 is connected to NODE 119:C_and the P channel gate of the pass gate device is connected to NODE 119:C. NODE 6 is coupled through inverter 119:IV5 to one terminal of SWITCH 119:XSW1. The other terminal of SWITCH 119:XSW1 is connected to the PUD terminal. SWITCH 119:XSW1 is illustrated in the open position.

LVLDET—LATCHING VOLTAGE LEVEL DETECTOR —schematic FIG. 119.0

FIG. 1 is an alternative embodiment of the PUD circuit.

LVLDET has a same function as PUD circuit. But LVLDET uses a different method in achieving the PUD output.

Figure 2:
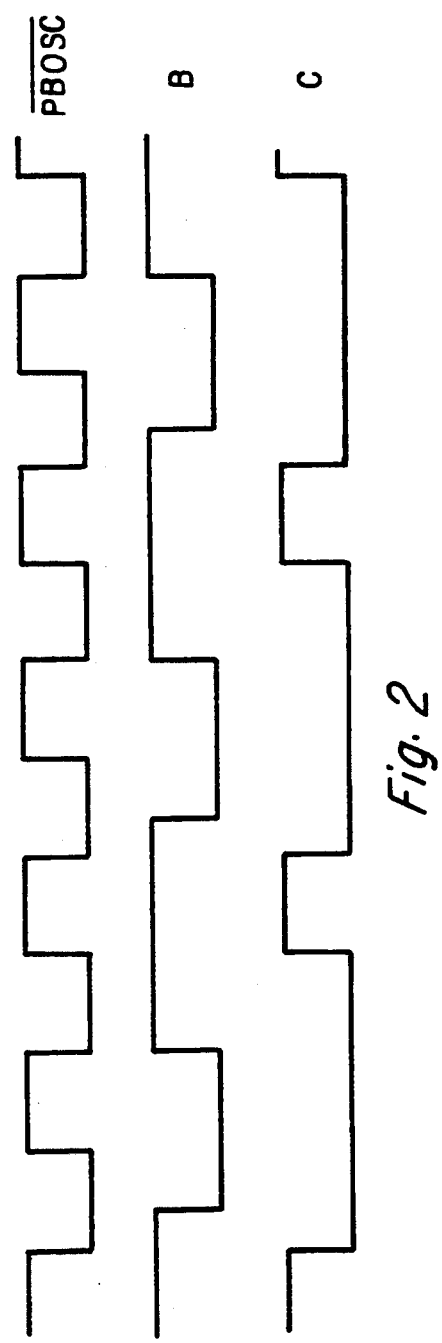
FIG. 2 is a signal diagram of the LVLDET circuit 119.

LVLDET uses PBOSC to sample the periphery voltage level. This voltage sampling is based on equalizing the voltage at node N2 and N1. To understand on how it works, lets take a look on the 'square' waveforms generated from PBOSC. These are illustrated in FIG. 2.

Two sets of main control waveforms are generated by PBOSC signal. They are waveform 'B'/'B_' and 'C'. These two sets of signal control the sampling of the periphery voltage. Note that XDB2 is a frequency divider circuit. It generates signal 'B' which has the frequency value of half PBPOSC. As for XD4 it is a delay that causes the falling edge of 'B' to be about 4ns later than its input falling edge.

Initially, when 'B' is low, node N1 of capacitor C1 is charged up to the current periphery voltage. At the same time, it also charges up N3 and discharges N4 to low. Next, as 'B' goes high, it turns on MN1. This enables the charge sharing process to occur between N1 and N2. The equalibrium voltage at N2 and N1 will be Veq, where;

$$Veq = \{C1/(C1+C2)\} * Vperi$$

If Veq is greater than the threshold voltage of MN3, node N3 will be discharged to ground with MN3 switched on. There is also a regenerative action that enhances this switching event. As the potential of N3 is pulled down, it turns on MP4. Thus with the high 'B' signal, it propagates to N4 and turns on MNSA to help the discharging of N3. But, if Veq is less than the threshold voltage, N3 remains high while N4 remains low. The VPERI needed to set Veq above this threshold can be preset be adjusting the capacitance C1 and C2.

Then as 'C' goes up, it allows the signal at node N4 to propagates to the output. If VPERI is not high enough, Veq will not be able to trip MN3. N4 is low and is the output. But if VPERI is high enough and Veq trips MN3, the output will be a logic '1'.

When 'C' signal drops low, the output is latched until next cycle. Signal 'B' goes down 8ns after 'C' goes down to create a proper latching action.

To summarize, LVLDET samples the periphery voltages to determine if it has reached the required level before triggering the output to a logic '1'. Sampling is based on PBOSC frequency. It samples every two cycles of PBOSC, ie in the first cycle, VPERI is sampled and in the second cycle, the sampled status is sent to output.

TPLHO—TOP PLATE HOLD OFF CIRCUIT
sehematic FIG. 125.0

The disclosed voltage level detection circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltge is above the reference potential. The voltage level detection circuitry is controlled by the oscillator signal, for controlling a voltage obtained from the external voltage, to the reading and writing circuitry and to the array to prevent the voltage from being applied unless the voltage is at least of a predetermined minimum value. It may contain a circuit for sampling the obtained voltage during selected oscillator cycles to determine whether the obtained voltage is above the predetermined value. Other elements may be added to further enhance performance of the circuit.

The voltage level detection circuit of the invention advantageously can detect the level of the applied voltage without requiring a sharp transition, or "edge". It effectively senses slow rising external voltage.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A power up detection circuit for detecting when a power source voltage reaches a certain level relative to a reference voltage, comprising:
    A. a voltage divider having a first node and a second node, the first node being coupled to the power source voltage at only selected times and the second node being connected to the reference voltage at only the selected times;
    B. a control signal source producing a control signal only between the selected times;
    C. a first switch connected between the first and second nodes for connecting together the first and second nodes in response to receiving the control signal, when connected the first and second nodes carrying an equilibrium voltage related to the power source voltage; and
    D. a second switch switching in response to the equilibrium voltage received from the second node attaining a threshold level.

2. The detection circuit of claim 1 in which the second switch is a transistor and the threshold level is the threshold voltage for the transistor to turn on.

3. The detection circuit of claim 2 in which the voltage divider includes a first capacitor connected to the first node and a second capacitor connected to the second node, the first capacitor is charged to the power source voltage, the second capacitor is discharged to a VSS potential and the first switch disconnects the first and second nodes in response to the control signal.

4. The detection circuit of claim 3 including latch circuits receiving and latching the output of the transistor of the second switch, and sample and hold circuits producing a power up detection signal from the latch circuits.

5. A level detection circuit to produce an output signal when a power supply attains a certain voltage level, comprising:
    A. a voltage divider having a first capacitor charged to the power supply, a second capacitor charged to VSS potential, and a switch connecting together the first and second capacitors to form on the two capacitors an equilibrium voltage related to the voltage level of the power supply;
    B. a transistor turning on in response to the equilibrium voltage received from the second capacitor attaining a threshold level related to the power supply attaining the certain voltage level; and
    C. output circuits producing an output signal having a logic level indicating that the power supply has attained the certain voltage level in response to the transistor turning on the output circuits including a latch that takes one state when the transistor turns on and including a sample and hold circuit that stores and maintains one logic level while the power supply remains above the certain voltage level, and stores and maintains another logic level while the power supply remains below the certain voltage level.

* * * * *